(12) United States Patent
Chilcott et al.

(10) Patent No.: US 8,482,090 B2
(45) Date of Patent: Jul. 9, 2013

(54) CHARGED PARTICLE COLLECTOR FOR A CMOS IMAGER

(75) Inventors: Dan Wesley Chilcott, Buchanan, VA (US); William J. Baney, Roanoke, VA (US); John Richard Troxell, Sterling Heights, MI (US)

(73) Assignee: Exelis, Inc., McLean, VA (US)

( * ) Notice: Subject to any disclaimer, the term of this patent is extended or adjusted under 35 U.S.C. 154(b) by 358 days.

(21) Appl. No.: 12/837,033

(22) Filed: Jul. 15, 2010

(65) Prior Publication Data

US 2012/0012958 A1    Jan. 19, 2012

(51) Int. Cl.
*H01L 31/115* (2006.01)

(52) U.S. Cl.
USPC .................. 257/429; 257/457; 257/E31.001

(58) Field of Classification Search
USPC ...... 257/429, 457, E31.006, E31.001; 438/56
See application file for complete search history.

(56) References Cited

U.S. PATENT DOCUMENTS

| | | | |
|---|---|---|---|
| 3,902,095 A | 8/1975 | Bierig | |
| 3,916,509 A | 11/1975 | Hoeberechts | |
| 6,396,118 B1 | 5/2002 | Theil et al. | |
| 7,023,126 B2 | 4/2006 | Smith | |
| 7,034,333 B1 * | 4/2006 | Fink | 257/48 |
| 7,214,920 B2 | 5/2007 | Gazeley | |
| 7,307,327 B2 | 12/2007 | Bahl et al. | |
| 8,003,952 B2 * | 8/2011 | Muray et al. | 250/396 R |
| 2002/0121605 A1 | 9/2002 | Fink | |
| 2005/0122021 A1 * | 6/2005 | Smith | 313/103 CM |

OTHER PUBLICATIONS

International Application Serial No. PCT/US2011/043488, International Search Report mailed Jan. 24, 2012, 5 pgs.

* cited by examiner

*Primary Examiner* — Tuan N. Quach
(74) *Attorney, Agent, or Firm* — RatnerPrestia

(57) ABSTRACT

Charged particle sensing devices and methods of forming charged particle sensing devices are provided. The charged particle sensing device includes a source of charged particles, a plurality of collector electrodes for receiving a first portion of the charged particles and a grid formed around and spaced apart from the plurality of collector electrodes. The grid receives a second portion of the charged particles and directs backscattered charged particles, generated responsive to the second portion, to adjacent collector electrodes.

20 Claims, 13 Drawing Sheets

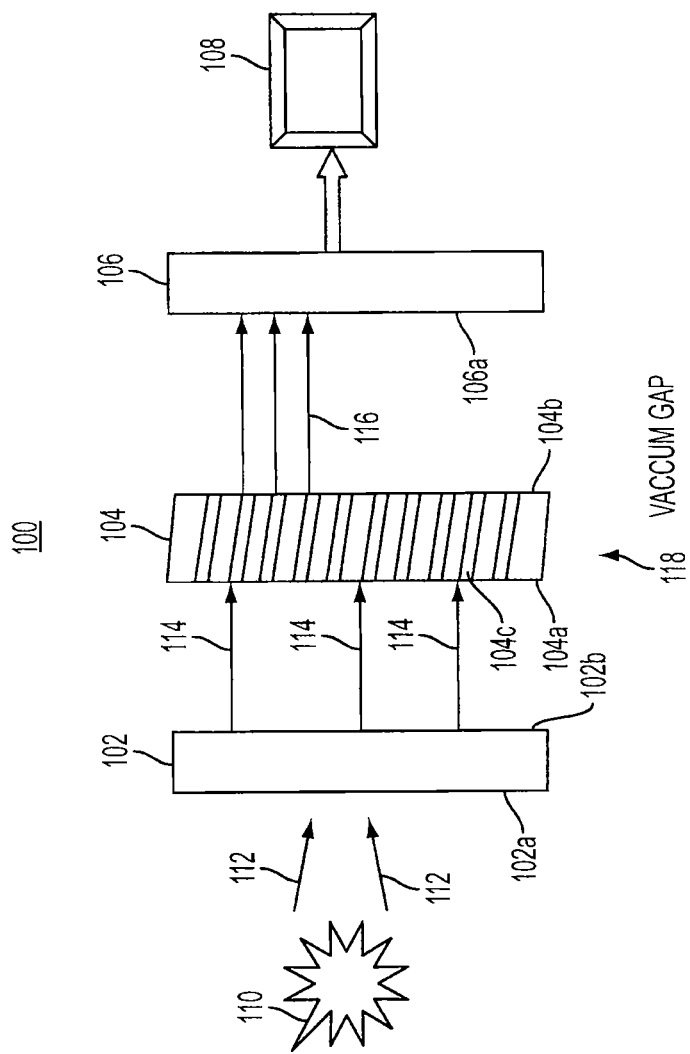

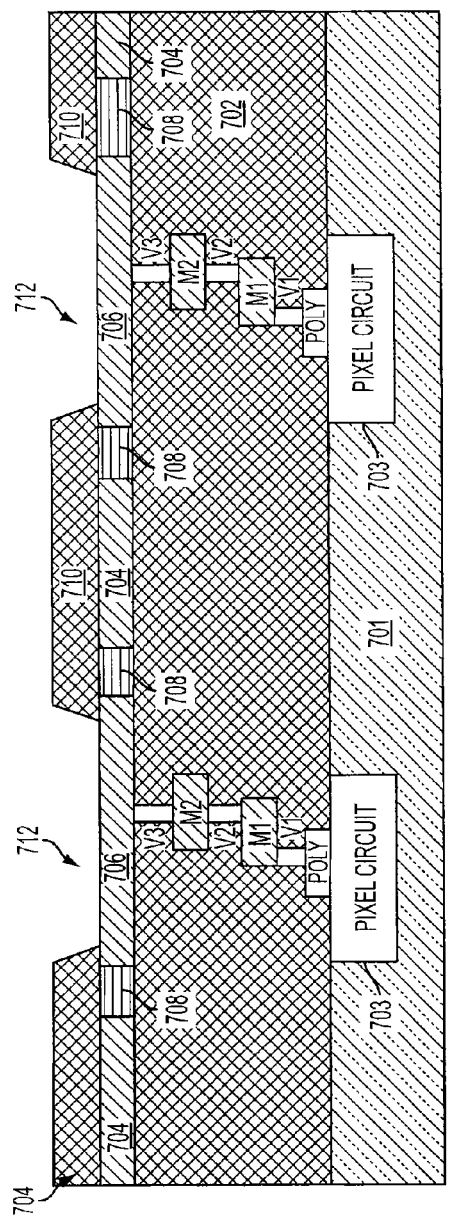

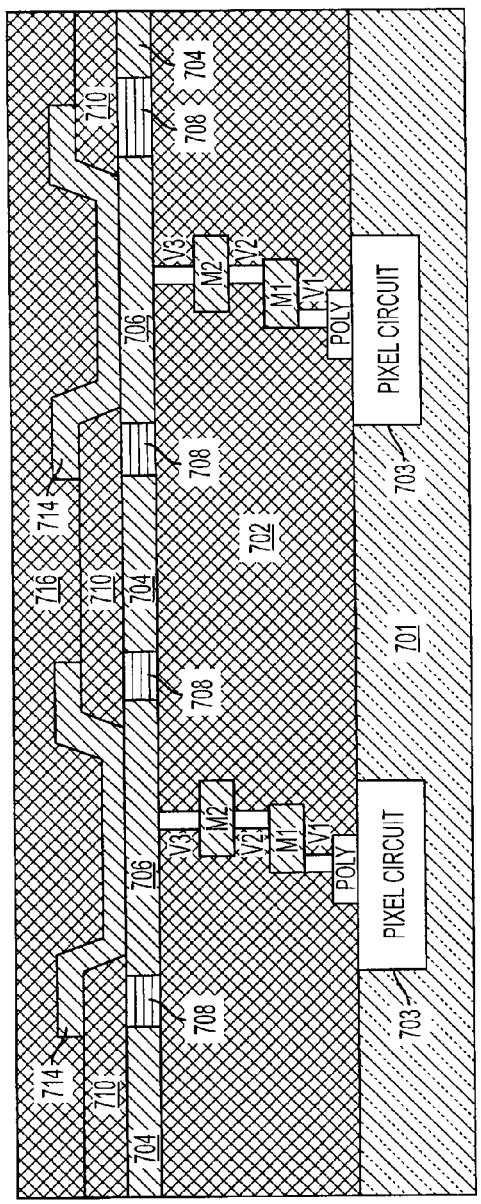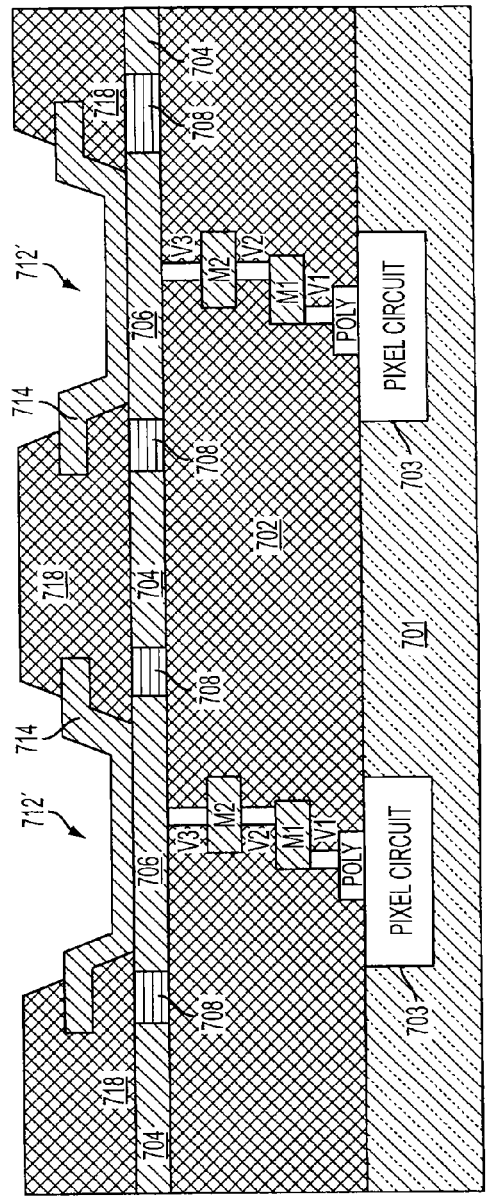
FIG.7G
FIG.7H

CHARGED PARTICLE COLLECTOR FOR A CMOS IMAGER

FIELD OF THE INVENTION

The present invention relates, in general, to charged particle sensing devices and, more specifically, to charged particle collector structures for collecting charged particles and for reducing crosstalk between the collector structures.

BACKGROUND OF THE INVENTION

Charged particle detectors that sense high energy charged particles are well known in the art and are used for a wide variety of applications, such as mass spectrometry, ion microscopy and night vision. One common charged particle detector includes a micro-channel plate (MCP) to intensify the number of charged particles (by generating secondary charged particles) and a florescent screen to detect the intensified charged particles. Another common charged particle detector includes a solid state active pixel sensor, which typically includes collector electrodes to collect incoming charged particles for a plurality of pixels. The pixel sensor detects the collected charged particles and integrates the charge. The signal charge is then read out by scanning pixels to generate a charged particle image.

A consequence of using high energy charged particles is the probability that some of the charged particles may be backscattered upon impact with the surface of the detector. The backscattered particles may produce a loss in signal and in spatial resolution. For solid state active pixel sensors, the collector electrodes are typically electrically isolated from each other, such as by a dielectric material. A consequence of the electrical isolation is that any dielectric material exposed between the collector electrodes may collect charge during bombardment of the charged particles and create crosstalk between the pixels. Another consequence of the electrical isolation is that the fill factor of the solid state pixel sensor (i.e., the ratio of the total charged particle collection surface area to the total contiguous area occupied by the pixel array) may be reduced, typically to be less than about 90%.

SUMMARY OF THE INVENTION

The present invention relates to charged particle sensing devices. The charged particle device includes a source of charged particles, a plurality of collector electrodes for receiving a first portion of the charged particles from the source and a grid formed around and spaced apart from the plurality of collector electrodes. The grid receives a second portion of the charged particles from the source and directs backscattered charged particles, generated responsive to the second portion, to adjacent collector electrodes.

The present invention also relates to charged particle sensing devices which include a source of charged particles and a charged particle collection surface for receiving the charged particles from the source. The charged particle collection surface includes a plurality of collector electrodes and a grid formed around and spaced apart from the plurality of collector electrodes. One of the grid and the plurality of collector electrodes includes a raised edge spaced apart from the charged particle collection surface.

The present invention further relates to a method of forming a charged particle sensing device. The method includes disposing a plurality of collector electrodes on a charged particle collection surface and disposing a grid on the charged particle collection surface. The grid is formed around and spaced apart from the plurality of collector electrodes.

BRIEF DESCRIPTION OF THE DRAWINGS

The invention may be understood from the following detailed description when read in connection with the accompanying drawing. Included in the drawing are the following figures:

FIG. 1 is a schematic diagram of a charged particle sensing device, according to an exemplary embodiment of the present invention;

FIGS. 7A, 7B, 7C, 7D, 7E, 7F, 7G, 7H, 7I, 7J and 7K are partial cross-sectional diagrams illustrating fabrication of an imager according to a further exemplary embodiment of the present invention.

DETAILED DESCRIPTION OF THE INVENTION

Figure 2A:
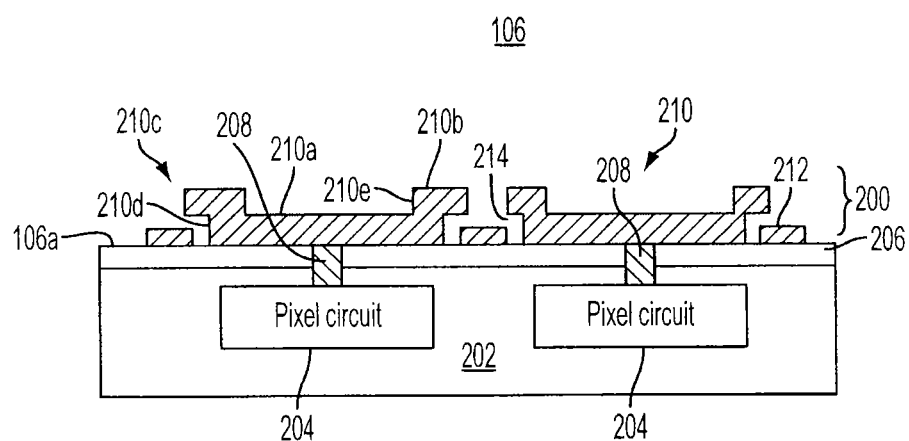
FIG. 2A is a cross-section diagram of a portion of the imager shown in FIG. 1, according to an exemplary embodiment of the present invention.

Aspects of the present invention relate to charged particle sensing devices having charged particle collection structures and methods of collecting charged particles. According to an exemplary embodiment, the charged particle collection structures include a plurality of collector electrodes and a grid formed around and spaced apart from the collector electrodes. The grid may provide shielding to an isolation region between the collector electrodes. The collector electrodes collect a portion of incident charged particles. The grid receives a further portion of the incident charged particles. The charged particles that are received by the grid are channeled away from the isolation region between the collector electrodes. Any backscattered charged particles generated by the grid are directed back to the grid or to neighboring collector electrodes.

Exemplary collector electrodes may be formed with a non-uniform shape and may include one or more wells, to provide collection of backscattered charged particles. Collection structures of the present invention provide collection of backscattered charged particles and may reduce the exposure of dielectric material between the collector electrodes and grid to incident and/or backscattered charged particles. Collection structures of the present invention may also increase a fill factor for the sensor, such that the fill factor may be greater than 90%. Charged particle sensing devices of the present invention may be used, for example, for mass spectrometry, including secondary ion mass spectrometry (SIMS), electron microscopy, night vision, medical and life sciences instrumentation and other applications involving low-light imaging areas.

Referring to FIG. 1, a charged particle sensing device is shown, designated generally as 100. Device 100 may be used, for example, as an image intensifier. Device 100 includes photocathode 102 having input side 102a and output side 102b. Device 100 also includes imager 106 including charged particle collection surface 106a. Device 100 may also include micro-channel plate (MCP) 104 which includes input side 104a and output side 104b. MCP 104 is disposed within vacuum gap 118 formed in a housing (not shown) incorporating photocathode 102 and imager 106.

Although MCP 104 is shown disposed between photocathode 102 and imager 106, it will be understood that MCP 104 may be omitted. Although photocathode 102 is shown, it will be understood that photocathode 102 may be replaced with a cathode, where the cathode provides a source of charged particles.

Imager 106 may be any type of solid state sensor capable of detecting charged particles. For example, imager 106 may include a complementary metal oxide semiconductor (CMOS) sensor. As described further below with respect to FIGS. 2A-7K, charged particle collection surface 106a includes a plurality of collection structures, which collect incident charged particles and provide an electrical return path for backscattered electrodes.

In operation, light 112 from image 110 enters device 100 through input side 102a of photocathode 102. Photocathode 102 changes the entering light 112 into charged particles 114, such as electrons, which are output from output side 102b of photocathode 102. Charged particles 114, exiting photocathode 102, enter channels 104c through input surface 104a of MCP 104. After charged particles 114 bombard input surface 104a of MCP 104, secondary charged particles are generated within the plurality of channels 104c of MCP 104. MCP 104 may generate several hundred charged particles in each of channels 104c for each charged particle entering through input surface 104a. Thus, the number of charged particles 116 exiting channels 104c may be significantly greater than the number of charged particles 114 entering channels 104c. The intensified number of charged particles 116 exit channels 104c through output side 104b of MCP 104, and strike charged particle collection surface 106a of imager 106. The output of imager 106 may be stored in a register, then transferred to a readout register, amplified and displayed on video display 108.

Figure 2B:
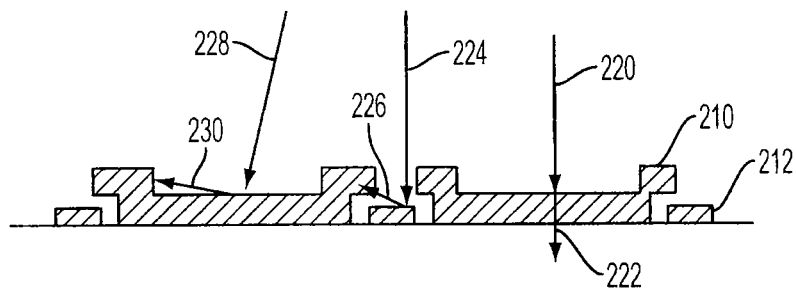
FIG. 2B is a cross-section diagram of the particle collection structures shown in FIG. 2A, illustrating collection of incident and backscattered charged particles, according to an exemplary embodiment of the present invention.

Referring to FIGS. 2A and 2B, imager 106 having particle collection structures 200 is shown. In particular, FIG. 2A is a cross-section diagram of a portion of imager 106; and FIG. 2B is a cross-section diagram of a portion of particle collection structures 200, illustrating collection of incident and backscattered charged particles.

Imager 106 includes pixel circuits 204 formed in substrate 202 and particle collection structures 200 formed on charged particle collection surface 106a. Imager 106 may also include dielectric layer 206 formed between substrate 202 and particle collection structures 200. Particle collection structures 200 includes charged particle collector electrodes 210, associated with respective pixel circuits 204, and grid 212. Collector electrodes 210 are electrically connected to respective pixel circuits 204 by connectors 208. Each pixel circuit 204 may include one or more transistors (not shown) configured to detect charged particles received from respective collector electrode 210 and to integrate the charge. Grid 212 functions to collect and provide an electrical return path for charged particles that are not incident on collector electrodes 210. An isolation region is formed between grid 212 and dielectric layer 206, where grid 212 may provide shielding to this isolation region from incident charged particles.

Each collector electrode 210 includes an incident surface including recessed surface 210a, raised surface 210b and side walls 210e. In addition, collector electrode 210 includes a raised edge 210c that is spaced apart from charged particle collection surface 106a. Furthermore, as will be described further below, collector electrode 210 includes side surfaces 210d that are used to collect backscattered electrodes from grid 212. Accordingly, it will be appreciated that collector electrode 210 is formed in a non-uniform shape. Although the incident surfaces 210a, 210b, 210c are shown to form a rectangular-shaped well, it will be appreciated that side walls 210e may include a slope, such that incident surfaces 210a, 210b, 210c form a trapezoidal-shaped well. For a trapezoidal-shaped well, the dimensions of the bottom surface (i.e., recessed surface 210a), may be less than the dimensions of the top surface (i.e., raised surface 210b).

Grid 212 surrounds collector electrodes 210 and is spaced apart from side walls 210d and raised edges 210c of collector electrodes 210 by gap 214 (which includes both a horizontal and vertical gap), with raised edges 210c formed above grid 212. Because collector electrodes 210 and grid are formed on dielectric layer 206 and are spaced apart by gap 214, collector electrodes 210 and grid 212 are electrically isolated from each other. Because grid 212 is positioned between collector electrodes 210, fewer backscattered charged particles may be directed to dielectric layer 206. Accordingly, crosstalk between pixels may be reduced.

Substrate 202 may include any suitable semiconductor substrate such as, but not limited to, silicon. Dielectric layer 206 may include any suitable electrically insulating material including, but not limited to, glass, ceramic, and metal oxides. Collector electrodes 210 and grid 212 may include any suitable conductive material, including, but not limited to, aluminum, copper and gold.

In operation, a portion 220 of incoming charged particles strike the incident surface of collector 210 (e.g., recessed surface 210a, raised surface 210b or side walls 210e) and are collected as collected particles 222 through connector 208, to produce a signal through the transistors of respective pixel circuit 204.

A further portion 224 of incoming charged particles may pass between collector electrodes 210 and collide with grid 212 in gap 214. The collision of portion 224 with grid 212 may generate backscattered charged particles 226. Backscattered charged particles 226 may propagate through gap 214 and be collected by a neighboring collector electrode 210 via side wall 210d and/or raised edge 210c. In general, the amount of backscattered charged particles 226 collected by side wall 210d and/or raised edge 210c may be controlled by any overlap in the horizontal direction of raised edge 210c and a vertical gap between side wall 210d and grid 212.

An additional portion 228 of incoming charged particles may collide with recessed surface 210a and generate backscattered charged particles 230. Because collector electrode 210 includes a well, backscattered charged particles 230 may be collected by side walls 210e of collector electrode 210. In general, the probability of backscatter (such as from portions 224 and 228) is related to the material properties of collector electrode 210, the impact energy of the charged particle and the angle of incidence of the charged particle.

It will be appreciated that the fill factor may also be controlled by the separation of collector electrodes 210. Because collector electrodes 210 include raised edges 210c, collector electrodes 210 may be spaced closer together. Accordingly, the fill factor may be increased, for example, to greater than 90%.

Figure 3A:
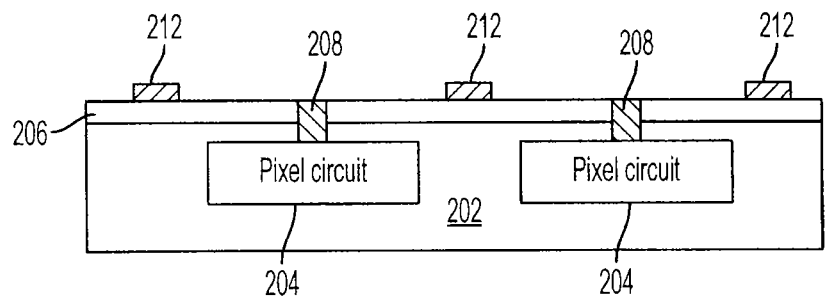
FIGS. 3A, 3B, 3C are partial cross-sectional diagrams illustrating fabrication of the imager shown in FIG. 2, according to an exemplary embodiment of the present invention.
Figure 3B:
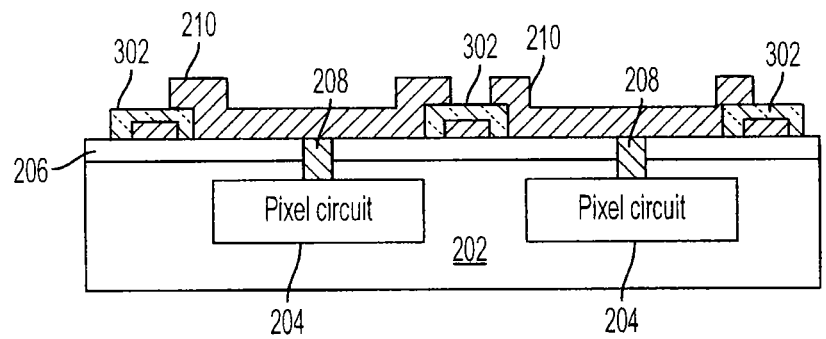
Figure 3C:
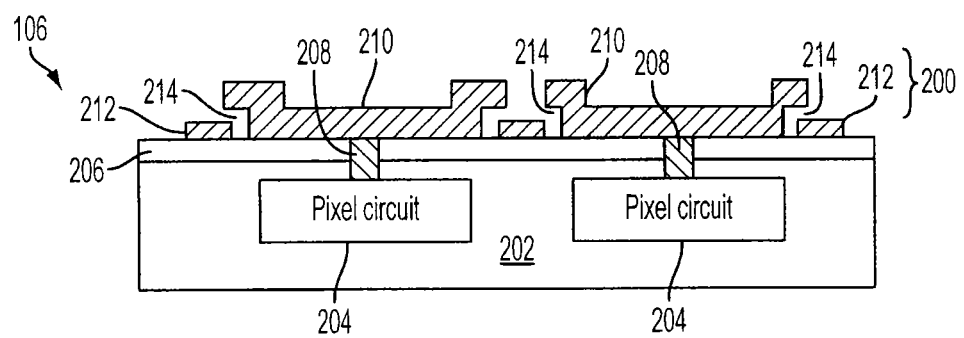

Referring next to FIGS. 3A-C, partial cross-sectional diagrams of imager 106 are shown, illustrating a process for manufacturing particle collection structures 200. As shown in FIG. 3A, pixel circuit 204 is formed for each pixel in substrate 202. Dielectric layer 206 may be formed over substrate 202. Connectors 208 may be formed to penetrate dielectric layer 206 and substrate 202 and provide signal to respective pixel circuits 204. Grid 212 is then formed on dielectric layer 206, such that grid 212 is positioned between pixel circuits 204.

Referring to FIG. 3B, sacrificial material 302 is formed and patterned to enclose grid 212. Sacrificial material 302 may be any suitable material including, but not limited to, a polymer, a metal or a semiconductor material. A conductive layer is deposited and patterned to form collector electrodes 210 and to expose sacrificial material 302 in regions corresponding to grid 212. Collector electrodes 210 are formed to be electrically connected to respective pixel circuits 204 via connectors 208.

Referring to FIG. 3C, sacrificial material 302 is removed, for example, using a dry or wet etching process. Removal of sacrificial material 302 produces gaps 214 between collector electrodes 210 and grid 212, thus forming particle collection structures 200 of imager 106.

The formation of pixel circuits 204, dielectric layer 206, connectors 208, grid 212 and collector electrodes 210 may be understood by the skilled person from the description herein.

Figure 4A:
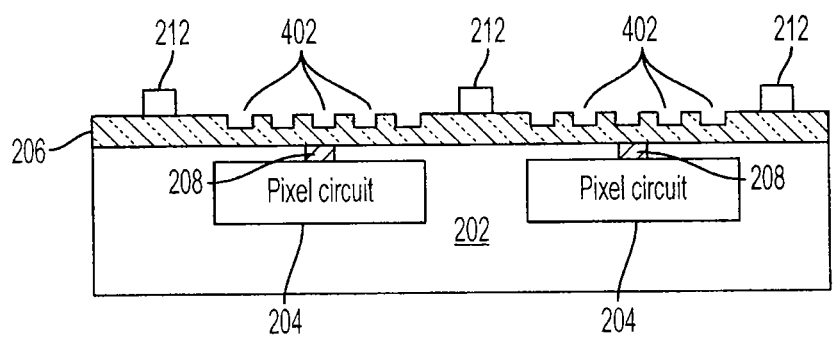
FIGS. 4A and 4B are partial cross-sectional diagrams illustrating fabrication of an imager according to another exemplary embodiment of the present invention.
Figure 4B:
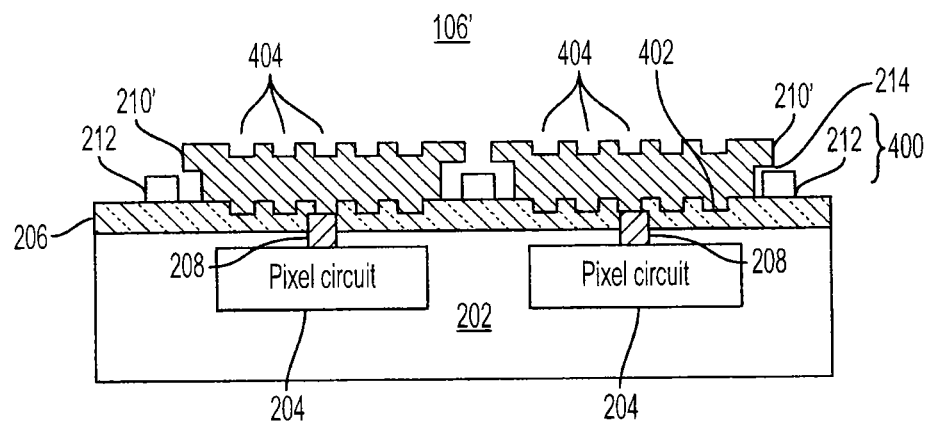

Referring next to FIGS. 4A and 4B, partial cross-sectional diagrams of imager 106' including particle collection structures 400 are shown, illustrating a process for manufacturing imager 106'. As shown in FIG. 4A, after dielectric layer 206 is formed on substrate 202, multiple wells 402 are etched or patterned into a top surface of dielectric layer 206. In addition, grid 212 is formed on dielectric layer 206, between pixel circuits 204, as described above with respect to FIG. 3A.

Although FIG. 4A illustrates wells 402 shaped as rectangular wells, wells 402 may also be shaped as other geometries, such as inverted pyramids. In this case, the base of the inverted pyramid may be a square at the top surface of dielectric layer 206 such that walls formed in dielectric layer 206 are extended from the base to form an apex of the inverted pyramid. According to an exemplary embodiment of the present invention, wells 402 may be transversely spaced between about 1-2 µm and may have a depth between about 1-2 µm. It can be appreciated that, in general, the spacing and depth of wells 402 may depend on the geometry of collector electrodes 210'.

Referring to FIG. 4B, a conductive layer is disposed on dielectric layer 206 to form collector electrodes 210'. Because wells 402 are formed in dielectric layer 206, wells 404 are subsequently formed in collector electrodes 210' which correspond with wells 402 (with respect to their position and shape). Thus, wells 404 may be formed in collector electrodes 210', without any substantial further etching of collector electrodes 210'. For example, if wells 402 are formed as inverted pyramids, subsequent wells 404 may also be formed as inverted pyramids. The slopes provided by the pyramids may deflect more of the backscattered charged particles into collector electrodes 210'.

It will be appreciated that wells 402, 404 may provide traps for backscattered charged particles. Although not shown in FIGS. 4A and 4B, a sacrificial material may also be formed over grid 212 (as discussed above with respect to FIGS. 3B and 3C) to form gaps 214, thus forming particle collection structures 400 of imager 106'. Although not shown in FIG. 4B, collector electrodes 210' may also include recessed regions on the top surface (such as recessed surfaces 210a shown in FIG. 2A).

Figure 5A:
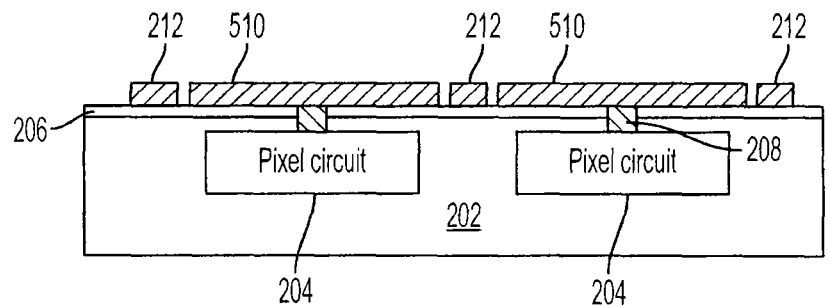
FIGS. 5A, 5B and 5C are partial cross-sectional diagrams illustrating fabrication of an imager according to a further exemplary embodiment of the present invention.
Figure 5B:
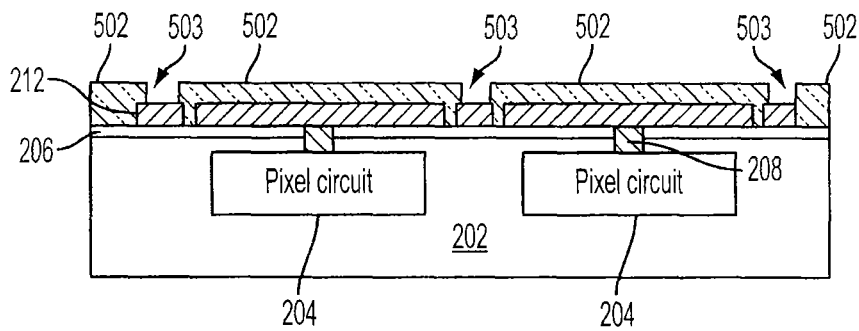
Figure 5C:
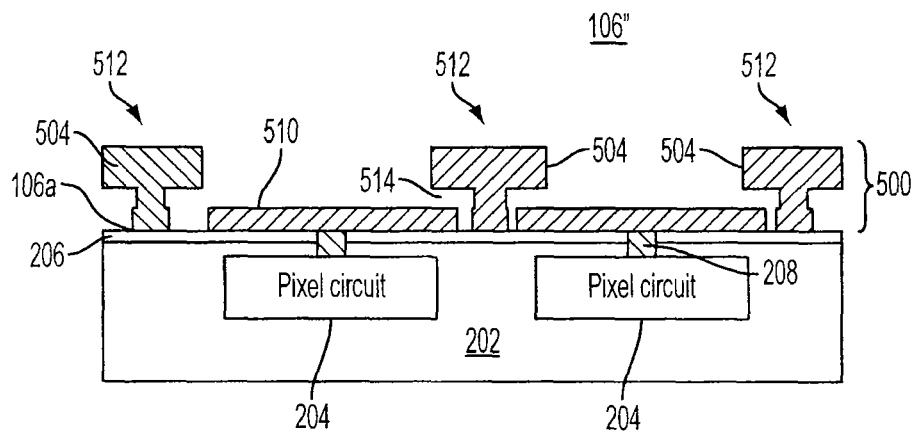

Referring next to FIGS. 5A-5C, partial cross-sectional views of imager 106" having particle collection structures 500 are shown, illustrating a process for manufacturing particle collection structures 500. As shown in FIG. 5A, collector electrodes 510 are formed over dielectric layer 206 to correspond with respective pixel circuits 204. In addition, grid 212 is formed on dielectric layer 206 to surround and to be spaced apart from collector electrodes 510.

Referring to FIG. 5B, sacrificial material 502 is formed over collector electrodes 510. Sacrificial material 502 is also etched or patterned to form regions 503 corresponding to grid 212.

Referring to FIG. 5C, conductive layer 504 is formed in regions 503 such that conductive layer 504 is connected to grid 212. Conductive layer 504 is also patterned or etched to expose sacrificial material 502 in regions corresponding to collector electrodes 510. Sacrificial material 502 is then removed, to form particle collection structures 500 of imager 106".

In imager 106", conductive layer 504 and grid 212 form barriers 512, with gaps 514 formed between barriers 512 and collector electrodes 510. Barriers 512 are formed with a thickness greater than a thickness of collector electrodes 510, such that barriers 512 are spaced above collector electrodes 510. Because a width of conductive layer 504 is greater than grid 212, conductive layer 504 overlaps collector electrodes 410. Particle collection structures 500 are similar to particle collection structures 200 (FIG. 3C) except that barriers 512 include a raised edge that extends above and overlaps collectors 510 in a direction normal to the collection surface 106a.

Although not shown in FIG. 5C, collector electrodes 510 may include a recessed surface (such as recessed surface 210a as shown in FIG. 2A) and/or wells (such as wells 404 as shown in FIG. 4B).

Figure 6A:
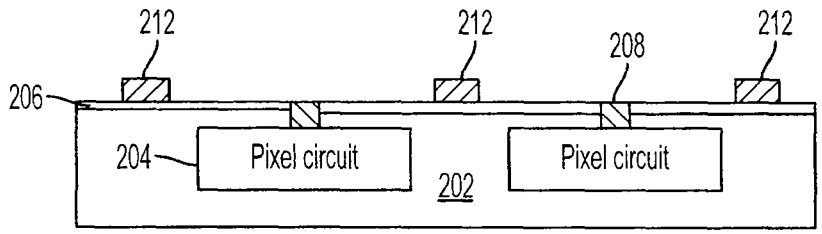
FIGS. 6A, 6B, 6C and 6D are partial cross-sectional diagrams illustrating fabrication of an imager according to a further exemplary embodiment of the present invention.

Referring next to FIGS. 6A-6D, partial cross-sectional views of imager 106'" including particle collection structure 600 are shown, illustrating a process for manufacturing particle collection structures 600. As shown in FIG. 6A, grid 212 is formed on dielectric layer 206 in regions between pixel circuits 204.

Figure 6B:
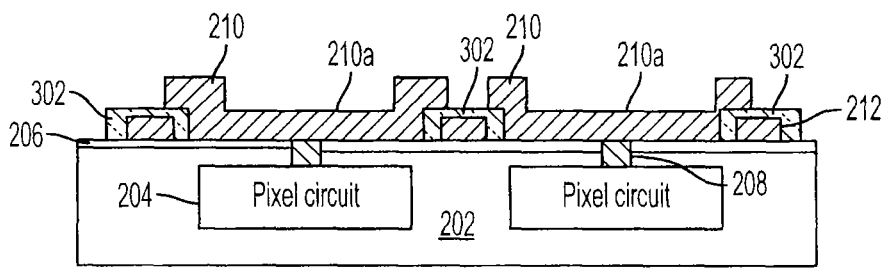

As shown in FIG. 6B, sacrificial material 302 is formed over grid 212, as described in FIG. 3B. In addition, a conductive layer is disposed on dielectric layer 206 in regions corresponding to pixel circuits 204 and patterned or etched to form collector electrodes 210 with recessed surfaces 210a.

Figure 6C:
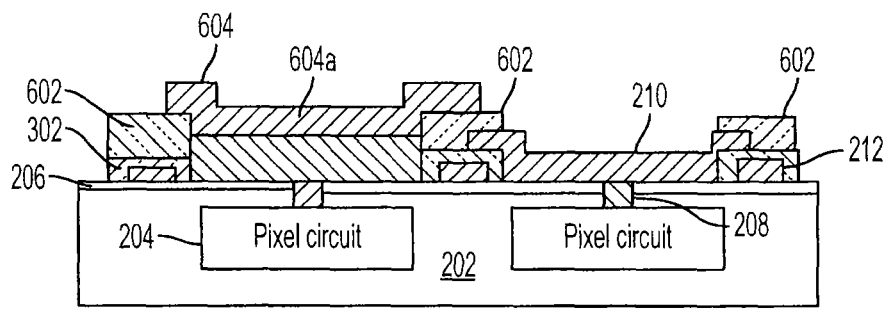

Referring to FIG. 6C, a further sacrificial material 602 is disposed over sacrificial material 302 between collector electrodes 210. A conductive layer 604 is then formed over alternating collector electrodes 210. Conductive layer 604 may be patterned or etched to form recessed surface 604A.

Figure 6D:
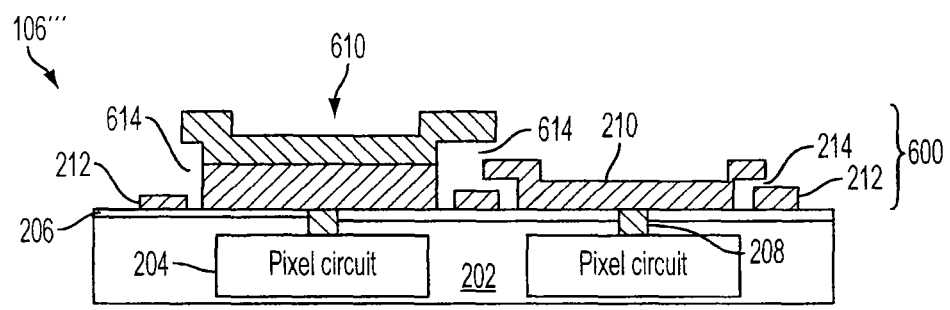

Referring to FIG. 6D, sacrificial materials 302 and 602 are removed, to form particle collection structure 600 of imager 106'". Structures 600 include grid 212 and collector electrodes 210 and 610. Collector electrodes 210 and 610 alternate with each other, where collector electrode 610 has a greater thickness than collector electrode 210. Removal of sacrificial material 302 and 602 forms gaps 214 and 614 between respective collector electrodes 210 and 610.

Because collector electrodes 210 and 610 have an alternating thickness (i.e., an alternating height), collector electrodes 210 and 610 can be substantially overlapped to eliminate most areas where charged particles may collect between electrodes (i.e., in gaps 214 and 614). In addition, the increased overlap between collector electrodes 210 and 610 may produce a fill factor of about 100%.

Figure 7A:
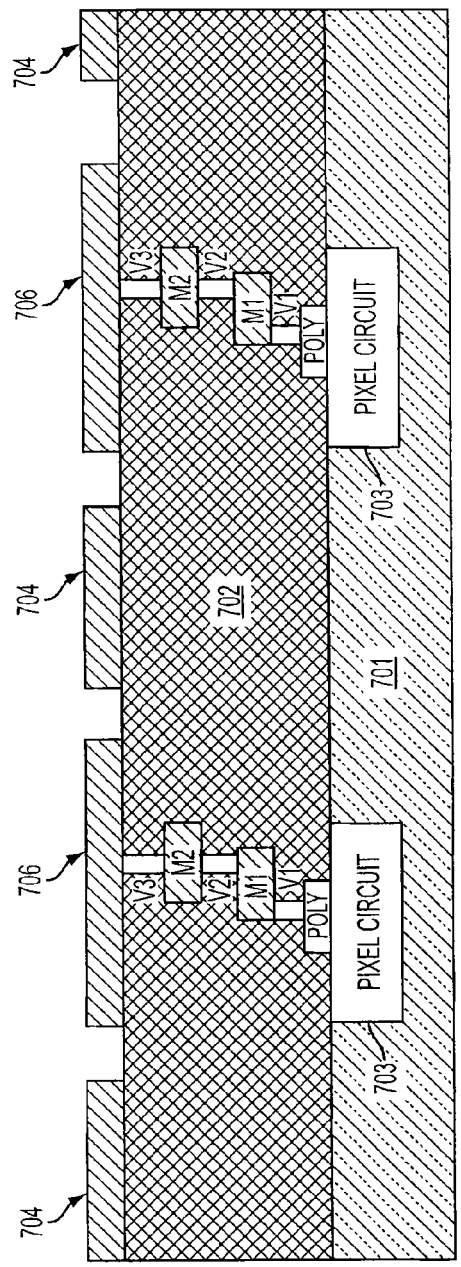

Referring next to FIGS. 7A-7K, partial cross-sectional views of imager 700 including particle collection structure 722 are shown, illustrating a process for manufacturing particle collection structure 722. As shown in FIG. 7A, imager 700 is formed by disposing a plurality of alternating metal and dielectric layers, designated generally as layer 702, on substrate 701. Layer 702 may include vias (V), e.g., V1, V2 and V3, and conductive connectors (M), e.g., M1 and M2, for providing signals from respective collector electrodes 722 (FIG. 7K) to respective pixel circuits 703. In an exemplary embodiment, the dielectric material in layer 702 includes silicon dioxide. In general, the dielectric material may include, without being limited to, silicon dioxide, silicon nitride, or any dielectric material suitable for back end of line (BEOL) processes. Grid 704 and conductive layer 706 are defined and formed on layer 702. Conductive layer 706 is formed in regions corresponding to respective pixels circuits 703. Grid 704 is formed to surround and to be spaced apart from conductive layer 706.

Figure 7B:
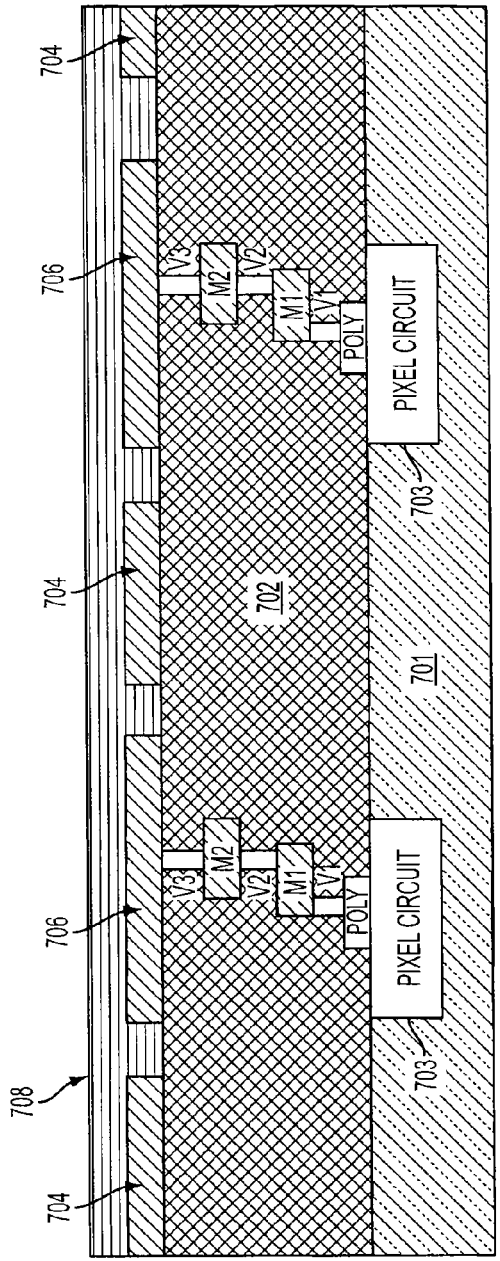

Referring to FIG. 7B, dielectric layer 708 is deposited on grid 704 and conductor layer 706, for electrical isolation. Grid 704 is thus spaced apart from conductive layer 706 by dielectric layer 708. According to an exemplary embodiment, dielectric layer 708 may be composed of a dielectric material that is different from the dielectric material in layer 702 and any dielectric layers disposed above dielectric layer 708 (such as dielectric layer 710 shown in FIG. 7D). For example, the dielectric material of layers 702 and 710 may include silicon dioxide, whereas the dielectric material of layer 708 may include silicon nitride.

Figure 7C:
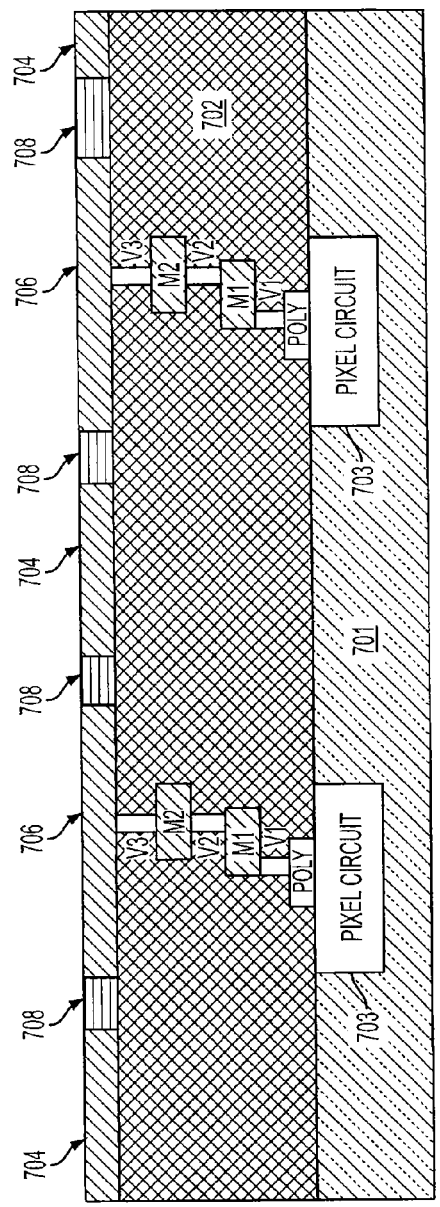

Referring to FIG. 7C, dielectric layer 708 is etched or planarized to expose grid 704 and conductive layer 706. Thus, dielectric layer 708 is formed in the regions between grid 704 and conductive layer 706.

Figure 7D:
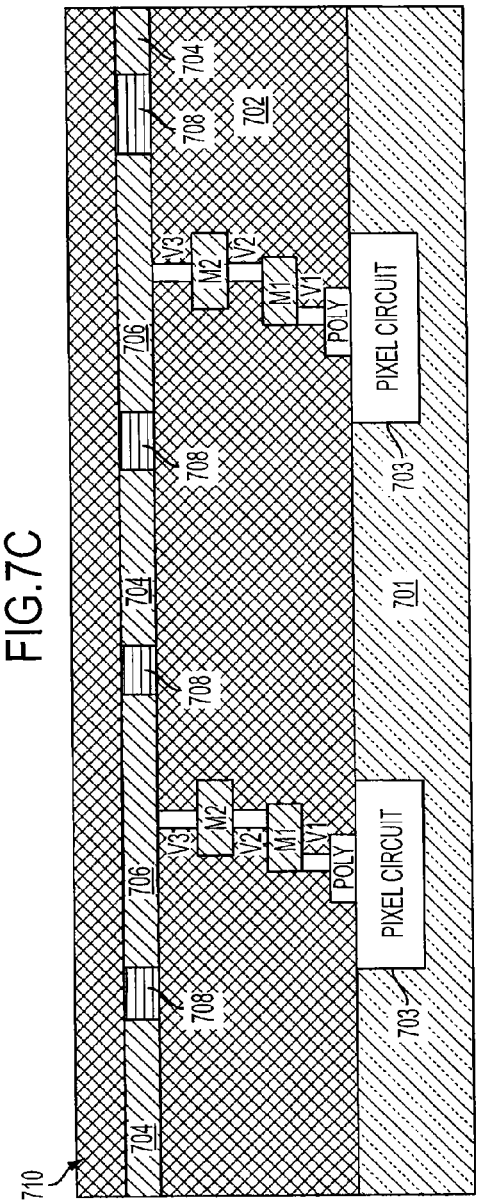

Referring to FIG. 7D, dielectric layer 710 is deposited above grid 704, conductive layer 706 and dielectric layer 708. Referring to FIG. 7E, portions of dielectric layer 710 are removed in collector regions 712 such that dielectric layer 710 includes side walls in collector regions 712 with a sloped or stepped profile.

Referring to FIG. 7F, conductive layer 714 is deposited on dielectric layer 710 within collector regions 712 and is coupled to conductive layer 706. Conductive layer 714 is also patterned or etched to create collector regions 713. In addition, regions 715 of dielectric layers 710 are defined to expose dielectric layer 710.

Referring to FIG. 7G, dielectric layer 716 is deposited over conductive layer 714 and dielectric layer 710. Referring to FIG. 7H, portions of dielectric layer 716 are then removed in collector regions 712' such that dielectric layer 716 includes side walls in collector regions 712' with a sloped or stepped profile. In FIG. 7H, the combination of dielectric layers 710 and 716 is referred to as dielectric layer 718.

Figure 7I:
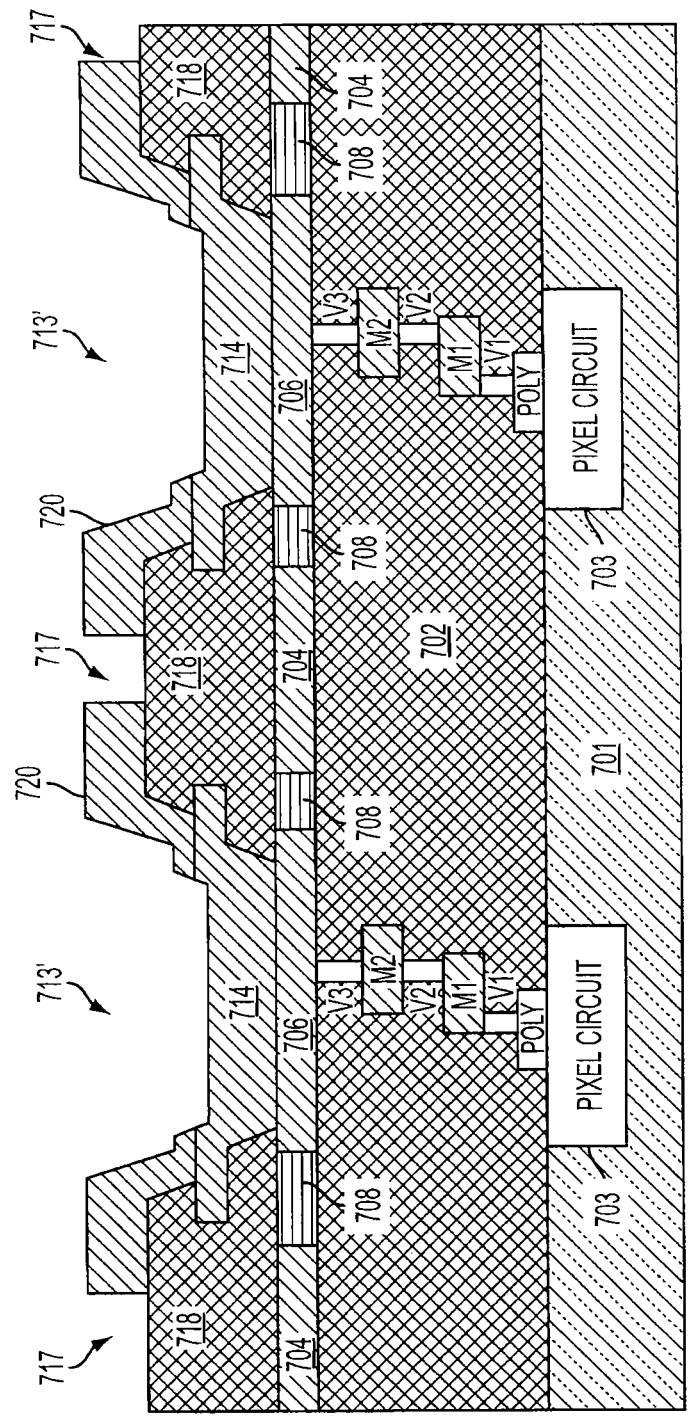

Referring to FIG. 7I, conductive layer 720 is deposited on dielectric layer 718 within collector regions 712' and is coupled to conductive layer 714. Conductive layer 720 is also patterned or etched to create collector regions 713'. In addition, regions 717 of conductive layer 720 are defined to expose dielectric layer 718.

Figure 7J:
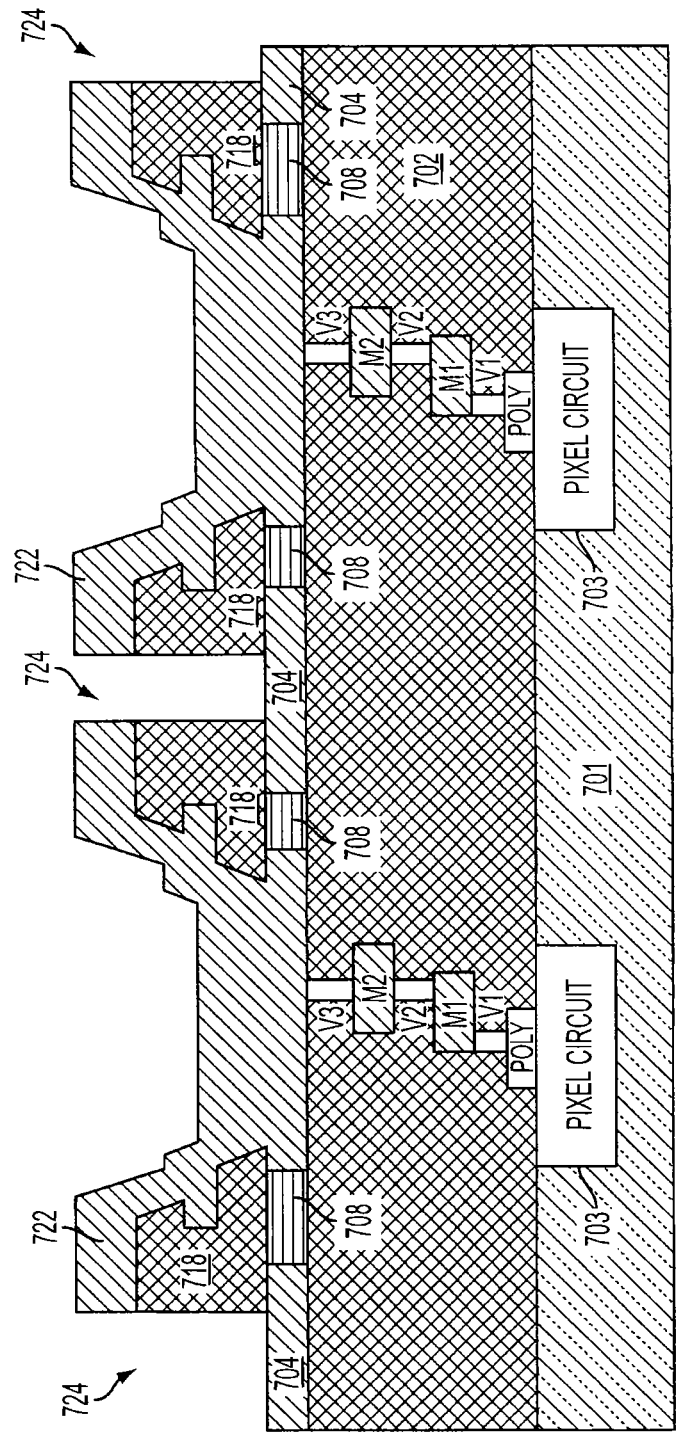
Figure 7K:
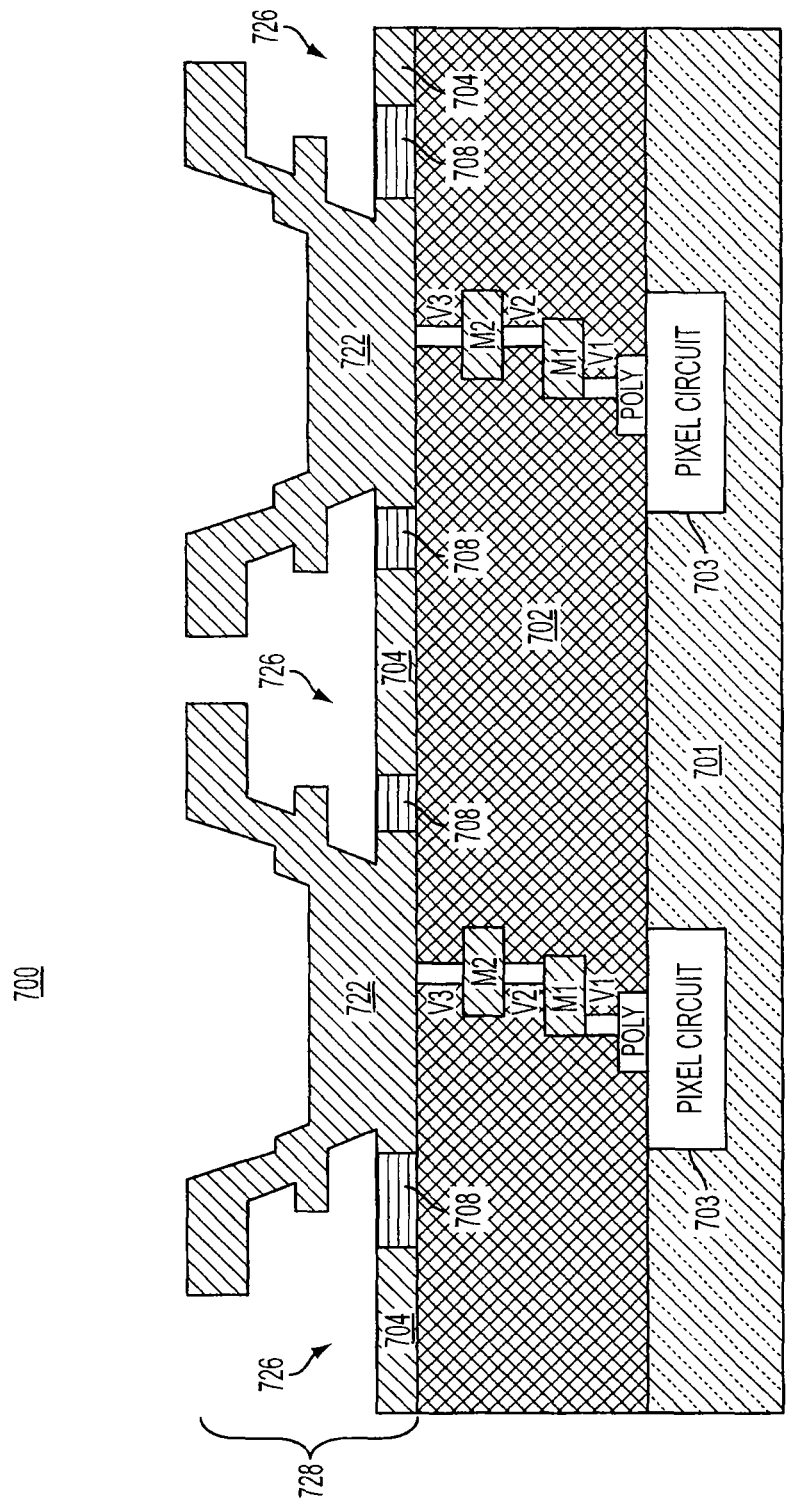

Referring to FIG. 7J, dielectric layer 718 is removed in regions 724 removed to expose grid 704, for example using a dry or wet etching process. In an exemplary embodiment, a dry etching process is used. As shown in FIG. 7J, the combination of conductive layers 706, 714 and 720 form collector electrodes 722. Referring to FIG. 7K, the remaining dielectric layer 718 is removed, for example, using a dry or wet etching process. In an exemplary embodiment, a wet etching process is used. The removal of dielectric layer 718 produces gaps 726 between collector electrodes 722 and grid 704, thus producing particle collection structure 728.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A charged particle sensing device comprising:
   a source of charged particles;
   a plurality of collector electrodes for receiving a first portion of the charged particles from the source of charged particles; and
   a grid formed around and spaced apart from the plurality of collector electrodes, the grid receiving a second portion of the charged particles from the source of charged particles and directing backscattered charged particles, generated responsive to the second portion, to adjacent collector electrodes,
   wherein the grid is isolated from the plurality of collector electrodes by a gap, and the gap is devoid of any dielectric materials.

2. The charged particle sensing device according to claim 1, wherein the grid is formed from a conductive material.

3. The charged particle sensing device according to claim 2, wherein the grid is electrically isolated from the plurality of collector electrodes.

4. The charged particle sensing device according to claim 1, wherein the plurality of collector electrodes includes first and second sets of collector electrodes having different thicknesses, and
   the first set of collector electrodes is arranged alternately with the second set of collector electrodes.

5. The charged particle sensing device according to claim 1, wherein each collector electrode is formed in a non-uniform shape.

6. The charged particle sensing device according to claim 1, further comprising a micro-channel plate (MCP) disposed between the source and the plurality of collector electrodes.

7. The charged particle sensing device according to claim 1, wherein each collector electrode includes an incident surface for receiving the first portion of charged particles, the incident surface including a recessed surface forming a well.

8. The charged particle sensing device according to claim 7, wherein the well is formed in one of a rectangular shape and a trapezoidal shape.

9. The charged particle sensing device according to claim 7, wherein the well directs backscattered charged particles generated responsive to the first portion of the charged particles to the corresponding collector electrode.

10. The charged particle sensing device according to claim 1, wherein each collector electrode includes an incident surface for receiving the first portion of charged particles, the incident surface including a plurality of wells.

11. The charged particle sensing device according to claim 10, wherein the plurality of collector electrodes are disposed on a dielectric layer, the dielectric layer including a plurality of wells corresponding to the plurality of wells in the respective collector electrode.

12. The charged particle sensing device according to claim 10, wherein a well of the plurality of wells is formed in one of a rectangular shape or an inverted-pyramid shape.

13. A charged particle sensing device comprising:
a source of charged particles; and
a charged particle collection surface for receiving the charged particles from the source of charged particles, the charged particle collection surface including:
a plurality of collector electrodes, and
a grid formed around and spaced apart from the plurality of collector electrodes,
wherein one of the grid and the plurality of collector electrodes includes a raised edge spaced apart from the charged particle collection surface, and
the grid is isolated from the plurality of collector electrodes by a gap, and the gap is devoid of any dielectric materials.

14. The charged particle sensing device according to claim 13, wherein each collector electrode includes an incident surface for receiving the charged particles, the incident surface including at least one well.

15. The charged particle sensing device according to claim 13, wherein the grid includes the raised edge.

16. The charged particle sensing device according to claim 15, wherein the raised edge of the grid is disposed above adjacent collector electrodes relative to the charged particle collection surface.

17. The charged particle sensing device according to claim 16, wherein the raised edge of the grid overlaps the corresponding collector electrodes in a direction normal to the charged particle collection surface.

18. The charged particle sensing device according to claim 13, wherein each collector electrode includes the raised edge.

19. The charged particle sensing device according to claim 18, wherein the plurality of collector electrodes includes first and second sets of collector electrodes having different thicknesses, and
the first set of collector electrodes is arranged alternately with the second set of collector electrodes.

20. The charged particle sensing device according to claim 19, wherein the raised edges of the first set overlap the raised edges of the second set in a direction normal to the charged particle collection surface.

* * * * *